(12) United States Patent
Tomita et al.

(10) Patent No.: US 6,667,485 B2
(45) Date of Patent: *Dec. 23, 2003

(54) ION IMPLANTING APPARATUS AND SAMPLE PROCESSING APPARATUS

(75) Inventors: Hiroyuki Tomita, Hitachi (JP); Kazuo Mera, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/283,158

(22) Filed: Oct. 30, 2002

(65) Prior Publication Data

US 2003/0052283 A1 Mar. 20, 2003

Related U.S. Application Data

(63) Continuation of application No. 09/461,222, filed on Dec. 16, 1999, now Pat. No. 6,501,080.

(30) Foreign Application Priority Data

Dec. 17, 1998 (JP) .......................... 10-359348

(51) Int. Cl.[7] .............................. G21K 5/10; H01J 37/08
(52) U.S. Cl. ................................................ 250/492.21
(58) Field of Search ...................... 250/492.21, 492.2, 250/443.1

(56) References Cited

U.S. PATENT DOCUMENTS

| | | | |
|---|---|---|---|
| 4,733,091 A | | 3/1988 | Robinson et al. |
| 4,817,556 A | | 4/1989 | Mears et al. |
| 4,965,862 A | * | 10/1990 | Freytsis et al. .......... 250/492.2 |
| 5,406,088 A | * | 4/1995 | Brune et al. ........... 250/492.21 |
| 5,422,490 A | * | 6/1995 | Nakamura et al. ..... 250/492.21 |
| 5,608,223 A | * | 3/1997 | Hirokawa et al. ...... 250/492.21 |
| 5,641,969 A | * | 6/1997 | Cooke et al. .......... 250/492.21 |
| 5,731,593 A | * | 3/1998 | Kodama ................. 250/492.21 |
| 5,753,923 A | | 5/1998 | Mera et al. |
| 5,945,681 A | | 8/1999 | Tokiguchi et al. |
| 6,043,499 A | | 3/2000 | Seki et al. |
| 6,104,025 A | | 8/2000 | Tokiguchi et al. |
| 6,163,033 A | * | 12/2000 | Smick et al. .......... 250/441.11 |
| 6,207,005 B1 | | 3/2001 | Henley et al. |
| 6,214,184 B1 | | 4/2001 | Chien et al. |
| 6,437,350 B1 | * | 8/2002 | Olson et al. ........... 250/492.21 |
| 6,501,080 B1 | * | 12/2002 | Tomita et al. .......... 250/492.21 |

FOREIGN PATENT DOCUMENTS

| | | |
|---|---|---|
| JP | 61-116746 | 6/1986 |
| JP | 4-225256 | 8/1992 |

OTHER PUBLICATIONS

Patent Abstracts of Japan, Abstract of JP 04–225256, filed Aug. 14, 1992.

* cited by examiner

*Primary Examiner*—John R. Lee
*Assistant Examiner*—Johnnie L Smith, II
(74) *Attorney, Agent, or Firm*—Mattingly, Stanger & Malur, P.C.

(57) ABSTRACT

Heat energy produced for heating is absorbed into a silicon wafer, and the thermal deformation of the silicon wafer is prevented. An ion implanting apparatus comprises an ion source for producing an ion beam; a process chamber for containing the silicon wafer; a rotating body disposed and rotated in the process chamber; a holding means for holding the silicon wafer of an object to be ion-implanted with a spacing between an ion implanted area of the object to be ion-implanted and the holding means, the holding means being connected to the rotating body; and a heating means for heating the silicon wafer in the process chamber, wherein the holding means holds the silicon wafer in a state in contact with a part of a region in an outer peripheral side of the silicon wafer, and blocks the silicon wafer to move toward an acting direction of a centrifugal force.

1 Claim, 9 Drawing Sheets

ION IMPLANTING APPARATUS AND SAMPLE PROCESSING APPARATUS

This is a continuation application of U.S. Ser. No. 09/461,222, filed Dec. 16, 1999, now U.S. Pat. No. 6,501,080.

BACKGROUND OF THE INVENTION

1. Field of the Invention

The present invention relates to an ion implanting apparatus and, more particularly to an SiMOX (Separation by Implanted Oxygen) ion implanting apparatus suitable for implanting oxygen ions into a silicon wafer.

2. Related Background Art

An ion implanting apparatus for oxygen ions into a silicon wafer having been known is that a plurality of wafer holders are fixed onto a rotating disk arranged inside a process chamber (a vacuum container), a disk-shaped silicon wafer being fixed onto each of the wafer holders, an ion beam from an ion source being irradiated on each of the silicon wafers while each of the silicon wafers is being rotated as the rotating disk is being rotated. The ion implanting apparatus of such a kind employs a holding structure disclosed, for example, in Japanese Patent Application Laid-Open No.61-116746 for fixing a silicon wafer onto the wafer holder. The holding structure is that the wafer holder is fixed in an inclining state to a rotating surface of the rotating disk, the silicon wafer being placed on the wafer holder, the silicon wafer being held down onto the wafer holder by a component of a centrifugal force caused by rotation of the rotating disk. In other words, the ion implanting apparatus employs the holding structure for holding the silicon wafer onto the wafer holder under a state that a reverse side surface of the silicon wafer is in contact with the disk-shaped wafer holder. When a silicon beam by oxygen ions is implanted into the silicon wafer, the silicon wafer is heated, for example, up to 600° C. using a heater in the process chamber, and then the ion beam is irradiated onto the silicon wafer to form an insulation film in the silicon wafer.

That is, in the SiMOX ion implanting apparatus, since it is necessary that the ion beam is implanted into the silicon wafer with a high voltage and a high current after the silicon wafer is heated up to a high temperature, the method employed is that the silicon wafer is initially heated up using the heater, and then the ion beam is irradiated onto the silicon wafer. In this case, control for keeping the silicon wafer at a constant high temperature condition is performed by heating by the ion beam and at the same time by adjusting an output power of the heater.

In the prior art, the silicon wafer is heated using the heater under the state that the reverse side surface of the silicon wafer is in contact with the wafer holder, and then the ion beam is irradiated on the silicon wafer in a high temperature state. Therefore, the temperature of the silicon wafer becomes difficult to be raised up and sometimes does not reach a high temperature state because heat of the silicon wafer is transmitted to the wafer holder even if the silicon wafer is heated using the heater. When the ion beam is irradiated on the silicon wafer under such a state, sometimes optimum ion implantation can not be obtained.

Further, when the reverse side surface of the silicon wafer is in contact with the wafer holder, a stress is produced by heating between the silicon wafer and the wafer holder. Therefore, sometimes cracks, chips and warps are produced in the silicon wafer when a thermal expansion occurs in the silicon wafer as the silicon wafer is being heated. At the same time, scraping occurs between the silicon wafer and the wafer holder, and particles may be produced from the silicon wafer by the scraping to reduce the quality of the silicon wafer. On the other hand, it can be considered to employ a structure floating a silicon wafer as disclosed in Japanese Patent Application Laid-Open No. Hei 4-225256, but the simply floating of wafer cannot sufficiently absorb the thermal deformation of the silicon wafer.

SUMMARY OF THE INVENTION

An object of the present invention is to provide an ion implanting apparatus which is capable of absorbing the thermal deformation of an object to be ion-implanted.

In order to attain the above-mentioned object, an ion implanting apparatus according to the present invention comprises an ion source for producing an ion beam; a process chamber for containing an object to be ion-implanted; a rotating body disposed and rotated in the process chamber; a holding means for holding the object to be ion-implanted with a spacing between an ion implanted area of the object to be ion-implanted and the holding means, the holding means being connected to the rotating body; an ion beam irradiation means for irradiating the ion beam from the ion source toward the object to be ion-implanted in the process chamber; and a heating means for heating the object to be ion-implanted in the process chamber, wherein the holding means holds the object to be ion-implanted in a state in contact with a part of a region in an outer peripheral side of the object to be ion-implanted, and blocks the object to be ion-implanted to move toward an acting direction of a centrifugal force.

Further, in order to attain the above-mentioned object, an ion implanting apparatus according to the present invention comprises an ion source for producing an ion beam; a process chamber for containing an object to be ion-implanted; a rotating body disposed and rotated in the process chamber; a holding means for holding the object to be ion-implanted with a spacing between an ion implanted area of the object to be ion-implanted and the holding means, the holding means being connected to the rotating body; an ion beam irradiation means for irradiating the ion beam from the ion source toward the object to be ion-implanted in the process chamber; and a heating means for heating the object to be ion-implanted in the process chamber, wherein the holding means comprises a plurality of holding portions for holding parts of regions in an outer peripheral side of the object to be ion-implanted, a first holding portion of the plurality of holding portions holding an end surface in a peripheral side of the object to be ion-implanted to block the object to be ion-implanted to move toward an acting direction of a centrifugal force, a second holding portion holding the end surface in the peripheral side of the object to be ion-implanted to allow the object to be ion-implanted to move in a direction opposite to the acting direction of the centrifugal force. In this case, the following elements may be added to the holding portion.

The second holding portion comprises a supporting piece for supporting the end surface in the outer peripheral side of the object to be ion-implanted; an elastic body connected to the supporting piece; and a fixing member for fixing the elastic body to the rotating body.

The second holding portion comprises a supporting piece for supporting the end surface in the outer peripheral side of the object to be ion-implanted; a first elastic body connected to the supporting piece; a supporting member for supporting an end of the first elastic body; a second elastic body connected to the supporting member; and a fixing member for fixing the second elastic body to the rotating body.

Further, in order to attain the above-mentioned object, the holding means according to the present invention comprises a holding portion for holding a part of region in an outer peripheral side of the object to be ion-implanted, and the holding portion holds a side end portion in the outer periphery of the object to be ion-implanted from both surface sides in an axial direction of the object to be ion-implanted. In this case, it is preferable that the holding portion holds a side end portion in the outer periphery of the object to be ion-implanted from both surface sides in an axial direction of the object to be ion-implanted.

When each of the ion implanting apparatus is constructed, the following elements may be added.

(1) The elastic body is formed of a coil spring.
(2) The elastic body is formed of a plate spring.
(3) Each of the first elastic body and the second elastic body is formed of a plate spring, and the plate springs are disposed so that directions of elastic forces of the plate springs become opposite to each other.
(4) A material of the holding portion is silicon or quartz when the object to be ion-implanted is formed of silicon.
(5) The ion implanting apparatus can process a silicone wafer as the object to be ion-implanted.

According to the present invention, the object to be ion-implanted is held with a spacing between an ion implanted area of the object to be ion-implanted and the holding means, and the object to be ion-implanted is held in a state in contact with a part of a region in an outer peripheral side of the object to be ion-implanted. Therefore, the object to be ion-implanted can be blocked to move toward an acting direction of a centrifugal force. When heat energy produced by the heater is transferred to the object to be ion-implanted, the heat energy is suppressed to be transferred to the other elements. Therefore, the object to be ion-implanted can be maintained at a high temperature state. Further, even if the object to be ion-implanted is thermally deformed by ion beam irradiation, the deformation can be absorbed. Accordingly, it is possible to prevent producing of particles by the thermal deformation such as thermal expansion.

Further, since the ion implanting apparatus has the structure to allow the object to be ion-implanted to move in a direction opposite to the acting direction of the centrifugal force, it is possible to maintain the object to be ion-implanted at a high temperature state and to prevent the object to be ion-implanted from being cracked, chopped and warped.

Further, in order to attain the above-mentioned object, a sample processing apparatus in accordance with the present invention comprises a process chamber for containing a sample to be processed; a rotating body disposed and rotated in the process chamber; and a holding means for holding the sample to be processed with a spacing between a processed area of the sample to be processed and the holding means, and for irradiating a beam onto the sample to be processed, the holding means being connected to said rotating body, wherein the holding means holds the sample to be processed in a state in contact with a part of a region in an outer peripheral side of the sample to be processed, and blocks the sample to be processed to move toward an acting direction of a centrifugal force.

According to the sample processing apparatus in accordance with the present invention, the object to be beam-irradiated is held with a spacing between an beam-irradiated area and the holding means, and the object to be beam-irradiated is held in a state in contact with a part of a region in an outer peripheral side of the sample to be processed. Therefore, the object to be beam-irradiated can be blocked to move toward an acting direction of a centrifugal force. When heat energy produced by the heater is transferred to the sample to be processed, the heat energy is suppressed to be transferred to the other elements. Therefore, the sample to be processed can be maintained at a high temperature state capable of being irradiated. Further, even if the object to be ion-implanted is thermally deformed by ion beam irradiation, the deformation can be absorbed. Accordingly, it is possible to prevent producing of particles by the thermal deformation such as thermal expansion.

DESCRIPTION OF THE PREFERRED EMBODIMENTS

Figure 1:
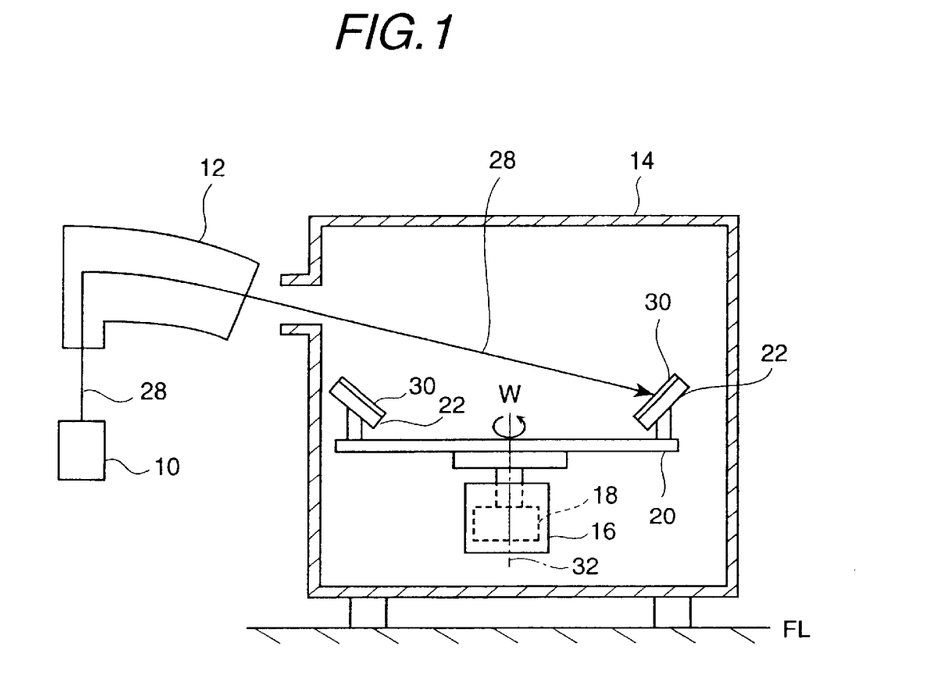
FIG. 1 is a view showing an overall structure of a first embodiment of an ion implanting apparatus in accordance with the present invention.

An embodiment of the present invention will be described below, referring to the accompanied drawings. FIG. 1 is a view showing an overall structure of an embodiment of an SiMOX ion implanting apparatus in accordance with the present invention.

Referring to FIG. 1, the SiMOX ion implanting apparatus is composed of an ion source 10; a mass separator 12; an end station 14 as a process chamber (vacuum container); a scan box 16; a rotating motor 18; a rotating disk 20 and a wafer holder 22, and the end station 14 is fixed onto a floor 26. The ion source 10 is constructed as an ion beam generating means for generating an ion beam, and the ion beam 28 emitted from the ion source 10 is separated to only ions having a preset mass by the mass separator (an ion beam irradiation means) 12. At that time, the ion beam 28 is converted to an ion beam mainly composed of a single kind of ions, for example, an ion beam composed of oxygen ions and incident into the end station 14. The ion beam 28 incident into the end station 28 is irradiated onto a silicon wafer 30 as an object to be ion-implanted held with the wafer holder 22.

There are a plurality of wafer holders 22, for instance, 17 wafer holders, and each of the wafer holders 22 is formed in a nearly disk-shape, arranged at and fixed to an outer peripheral side of the rotating disk 20 with a spacing between the wafer holders. In this case, each of the wafer holders 22 is fixed to the rotating disk 20 in an inclining state to a rotating plane of the rotating disk 20. The rotating disk 20 is driven to be rotated by the motor 18 in the scan box 16. That is, the rotating disk 20 as a rotating body is rotated around a rotating shaft 32 of the motor as the rotating center by rotational driving of the motor (a driving means) 18. As the rotating disk 20 is rotated, the silicon wafers 30 arranged above the rotating disk 20 are successively irradiated with the ion beam 28. Further, a heater (not shown) as a heating means is disposed in the end station 14 to heat the silicon wafers 30 up to, for example, 600° C. according to an instruction from a control panel (not shown) for outputting instructions to drive the motor 18.

Each of the silicon wafers 30 is formed in a nearly disk-shape, and held with a spacing between the reverse surface corresponding to an ion-implanted area of the silicon wafer 30 and the wafer holder 22 and in a state of a part of a region in an outer peripheral side of the silicon wafer 30 in contact with the holding means. That is, the silicon wafer 30 is blocked to move toward an acting direction of a centrifugal force and allowed to move in a direction opposite to the acting direction of the centrifugal force.

Figure 2:
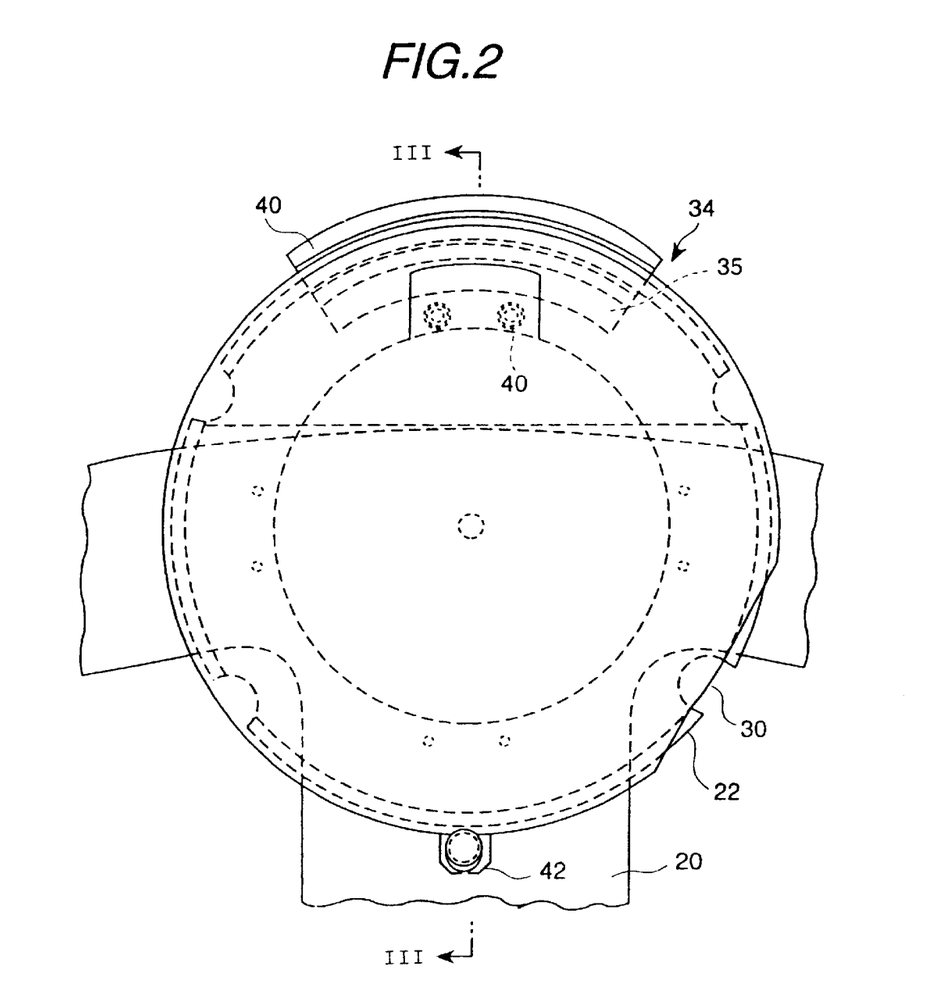
FIG. 2 is an enlarged plan view showing a main portion of FIG. 1.
Figure 3:
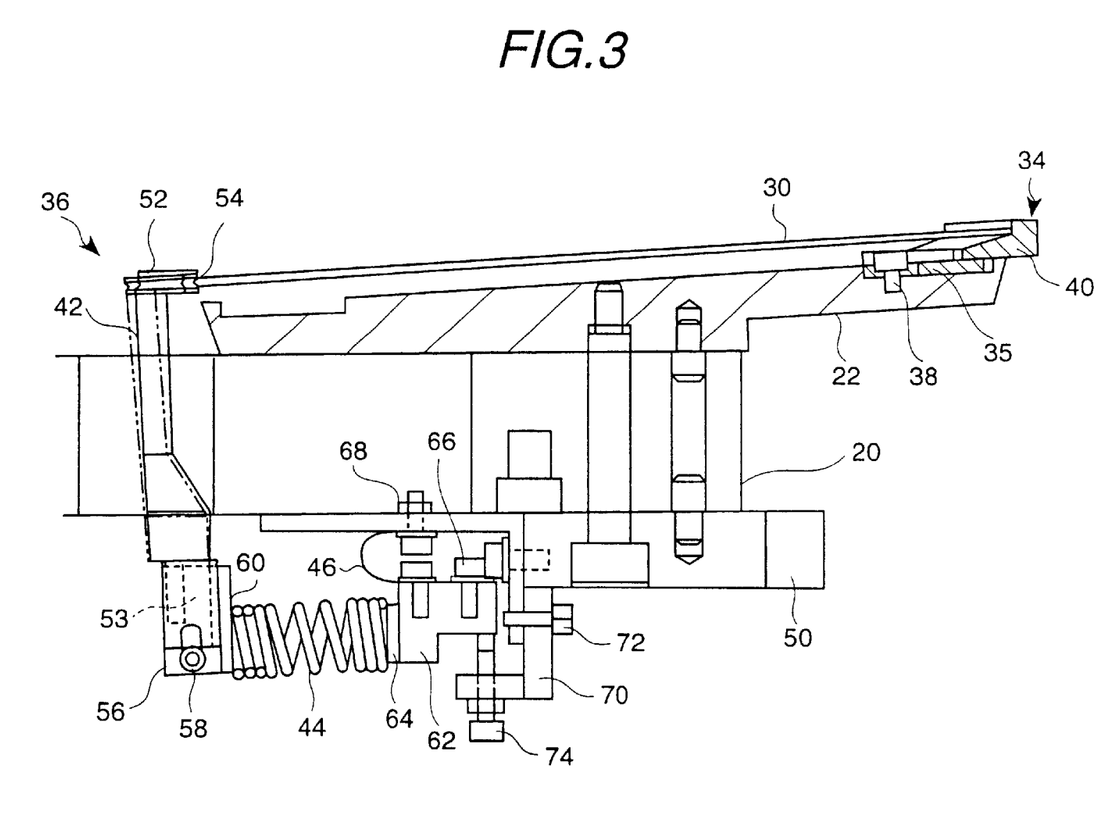
FIG. 3 is a cross-sectional view showing the main portion being taken on the plane of the line III—III of FIG. 2.

In more detail, the holding means for holding the silicon wafer 30 is composed of one holding portion 34 and another holding portion 36. The holding portion 34 and the holding portion 36 are arranged opposite to each other with respect to the center of the wafer holder 22. The holding portion 34 is disposed at a position corresponding to a region of the silicon wafer 30 most away from a rotating center of the rotating disk 20. The holding portion 34 is formed in a nearly arc-shape, and a main body 35 of the holding portion is fixed to the wafer holder 22 with bolts 38, and an arc-shaped guide 40 is formed in an outer peripheral side of the main body 35. The guide 40 supports the side end surface in the outer periphery of the silicon wafer 30 to block the silicon wafer 30 to move toward an acting direction of a centrifugal force caused by rotation of the rotating disk 20.

On the other hand, the holding portion 36 is composed of a wafer supporting piece 42 made of silicon, a coil spring 44 as an elastic body, a U-shaped plate spring 46, a bracket 48 as a fixing member and a positioning block 50, and the L-shaped bracket 48 and the positioning block 50 are individually fixed to the bottom surface side of the rotating disk 20. The wafer supporting piece 42 is formed as a shaft-shaped member which has a larger diameter portion 52 in the top side and a smaller diameter portion 53 in the bottom side. A ring-shaped groove 54 is formed in the larger diameter portion 52 and the side end surface in the outer periphery of the silicon wafer 30 is inserted in the groove 54. The smaller diameter portion 53 of the wafer supporting piece 42 is interposed between a U-shaped mounting clamp 56 and a screw 58, and a height of the wafer supporting piece 42 can be adjusted by loosing screw 58. Further, a projection 60 is formed in the bottom portion side of the mounting clamp 56, and one end of the coil spring 44 is inserted over the outer periphery of the projection 60. The other end of the coil spring 44 is inserted over a projection 62 of a mounting clamp 62, and the plate spring 46 is fixed to the top portion side of the mounting clamp 62 with a bolt 66. The other end of the plate spring 46 is fixed to the bracket 48 with a bolt 68. Further, a stopper 70 is joined to the bottom portion side of the bracket 48 with a bolt 72, and an adjusting screw 74 is attached to the stopper 70. A top end side of the screw 74 is in contact with the bottom portion side of the mounting clamp 62, and an opening angle of the plate spring 46 can be adjusted by adjusting a length of the adjusting screw 74. A position of the wafer supporting piece 42 can be set by adjusting the opening angle of the plate spring 46. Since an elastic force of the coil spring 44 disposed nearly parallel to the silicon wafer 30 act on the wafer supporting piece 42, the side surface in the outer peripheral of the silicon wafer 30 can be supported by the wafer supporting piece 42.

In the present embodiment, when the silicon wafer 30 is held, the reverse side surface of the silicon wafer 30 is not in contact with the wafer holder 22. Therefore, when heat energy produced by the heater is transferred to the silicon wafer 30, the heat energy in the silicon wafer 30 is suppressed to be transferred to the wafer holder 22. Therefore, temperature of the silicon wafer 30 can be raised fast, and the silicon wafer 30 can be maintained at a high temperature state, for example, at 600° C. Further, when the silicon wafer 30 is irradiated with the ion beam 28, the silicon wafer 30 can be heated to a high temperature and maintained at the high temperature state because the reverse side surface of the silicon wafer 30 is not in contact with the wafer holder 22.

On the other hand, when the silicon wafer 30 is thermally deformed in a direction along the radial direction or random directions by thermal expansion caused by the heater heating and the beam irradiation, the coil spring 44 is contracted to the expanded direction of the silicon wafer 30 and the wafer supporting piece 42 is moved so as to follow the thermal expansion movement of the silicon wafer 30. Thereby, the thermal expansion of the silicon wafer 30 can be absorbed. Therefore, occurrence of cracks, chips and warps caused by thermal stress of the silicon wafer 30 can be prevented, and generation of particles from the wafer supporting piece 42 and the wafer holder 22 can be prevented.

According to the present embodiment, the silicon wafer 30 can be maintained at a high temperature state, and occurrence of cracks, chips and warps in the silicon wafer 30 caused by thermal stress of the silicon wafer 30 can be prevented, and generation of particles can be prevented.

Figure 4:
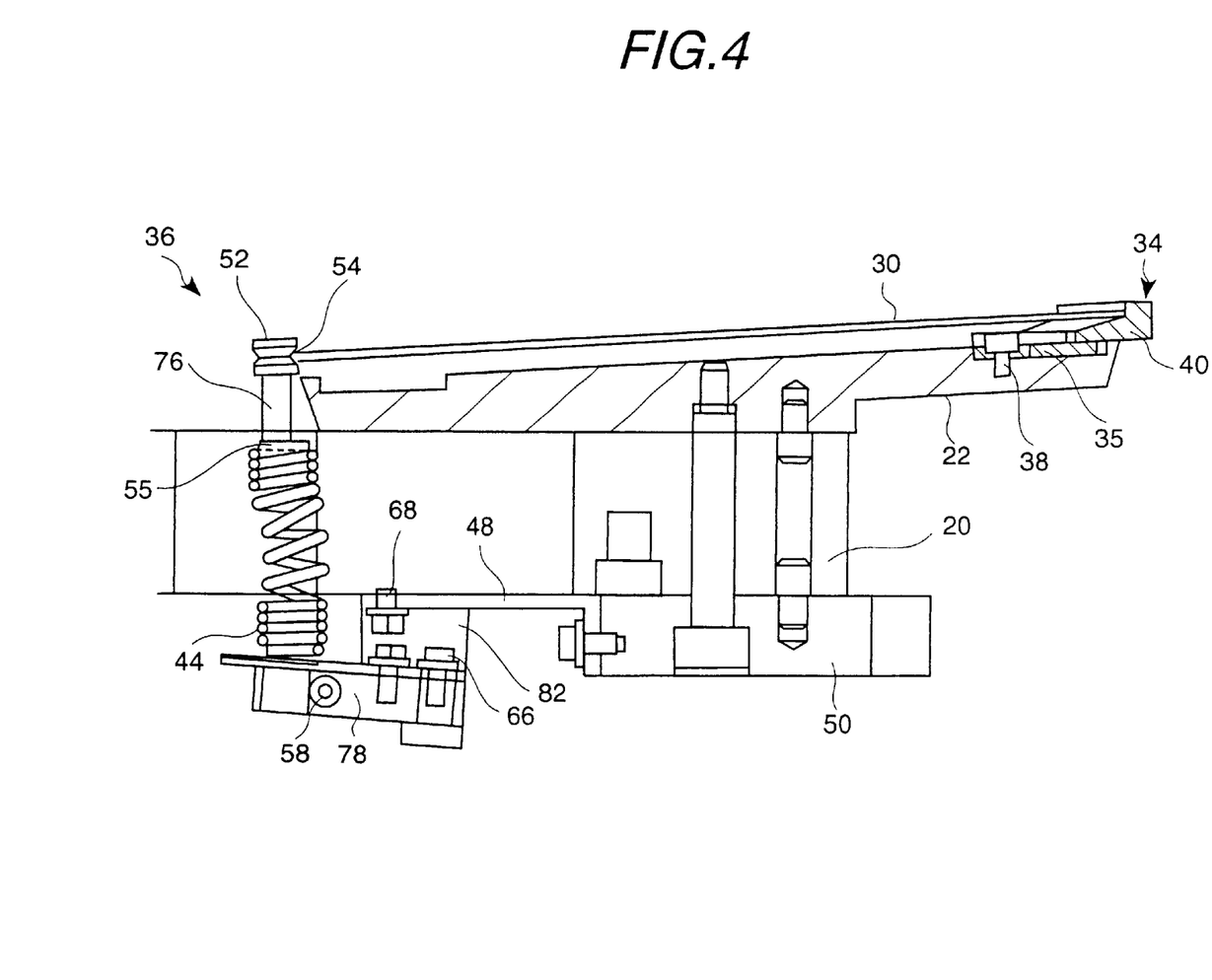
FIG. 4 is a cross-sectional view showing a main portion of a second embodiment of an ion implanting apparatus in accordance with the present invention.

A second embodiment of the holding portion 36 will be described below, referring to FIG. 4.

The holding portion 36 in this embodiment is composed of a wafer supporting piece 76, a coil spring 44, a mounting clamp 78, a bracket 48 and so on, and the coil spring 44 is disposed in a direction nearly perpendicular to the silicon wafer 30. The length of the wafer supporting piece 76 is formed shorter than that of the wafer supporting piece 42 of FIG. 3, and larger diameter portions 52, 55 are formed in both end portions in the axial direction. The side end surface in the outer periphery of the silicon wafer 30 is inserted into a groove 54 in the larger diameter portion 52, and one end of the coil spring 44 is attached to the larger diameter portion 55, and the other end of the coil spring 44 is attached to a pole 80 of the mounting clamp 78. An end of the pole 80 is fixed to the mounting clamp 78 in a state of being clamped by the mounting clamp 78 and fastened with a screw 58, and the height of the pole can be adjusted by loosing the screw 58. The mounting clamp 78 is joined to a bracket 82, and the bracket 82 is fixed to the bracket 48.

In this embodiment, when the silicon wafer 30 is thermally deformed due to thermal expansion, the coil spring 44 is bent to an expanded direction of the silicon wafer 30, that is, bent in a direction intersecting the axial direction of the wafer supporting piece 76 so that the wafer supporting piece 76 is moved following to the movement of the thermal expansion of the silicon wafer 30. Thereby, the thermal deformation caused by the thermal expansion of the silicon wafer 30 can be absorbed.

The present embodiment can be reduce the weight since the length of the wafer supporting piece 76 can be made shorter than that of the wafer supporting piece 42 of FIG. 3.

Figure 5:
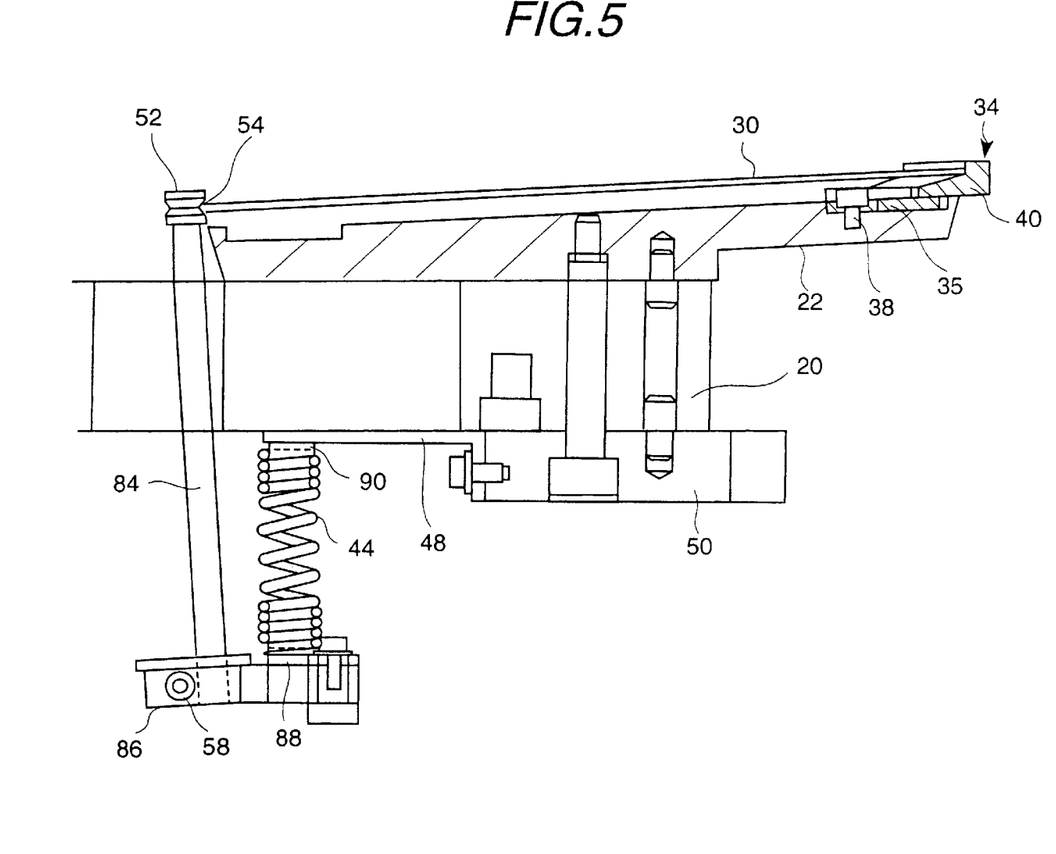
FIG. 5 is a cross-sectional view showing a main portion of a third embodiment of an ion implanting apparatus in accordance with the present invention.

A third embodiment of the holding portion 36 will be described below, referring to FIG. 5.

The holding portion 36 in this embodiment is composed of a wafer supporting piece 84, a coil spring 44, a mounting clamp 86, a bracket 88 and so on, and the bracket 88 is fixed to the rotating disk 20 through the positioning block 50.

The length of the wafer supporting piece 84 is formed longer than that of the wafer supporting piece 42 of FIG. 3, and one end portion in the axial direction of the wafer supporting piece 84 joined to the mounting clamp 86. A pole 88 is fixed to the mounting clamp 86 in a state of being clamped by the mounting clamp 86 and fastened with a screw 58, and one end of the coil spring 44 is attached to the pole 88. The coil spring 44 is arranged along the axial direction of the wafer supporting piece 84, and the other end of the coil spring 44 is attached to a pole 90 formed in the bottom portion side of the bracket 48.

In this embodiment, when the silicon wafer 30 is thermally deformed due to thermal expansion, the wafer supporting piece 84 is moved along an arc-locus around a bending point of the coil spring 44 as the center. That is, similar to the coil spring 44 in FIG. 3, the coil spring 44 is bent to an expanded direction of the silicon wafer 30, and the wafer supporting piece 84 is moved following to the movement of the thermal expansion of the silicon wafer 30.

According to the present embodiment, thermal expansion of the silicon wafer 30 can be absorbed, similarly to the holding portion 36 in each of the embodiments described above. Further, the radius of the arc-motion of the wafer supporting piece 84 is larger than that in each of the embodiments described above, motion of the wafer supporting piece 84 to the thermal expansion of the silicon wafer 30 becomes nearer to a straight line than in the case of each of the embodiments described above. Therefore, according to the present embodiment, production of extraneous objects and particles due to scrubbing between the wafer supporting piece 84 and the silicon wafer 30 can be reduced compared to in the case of each of the embodiments described above.

Figure 6A:
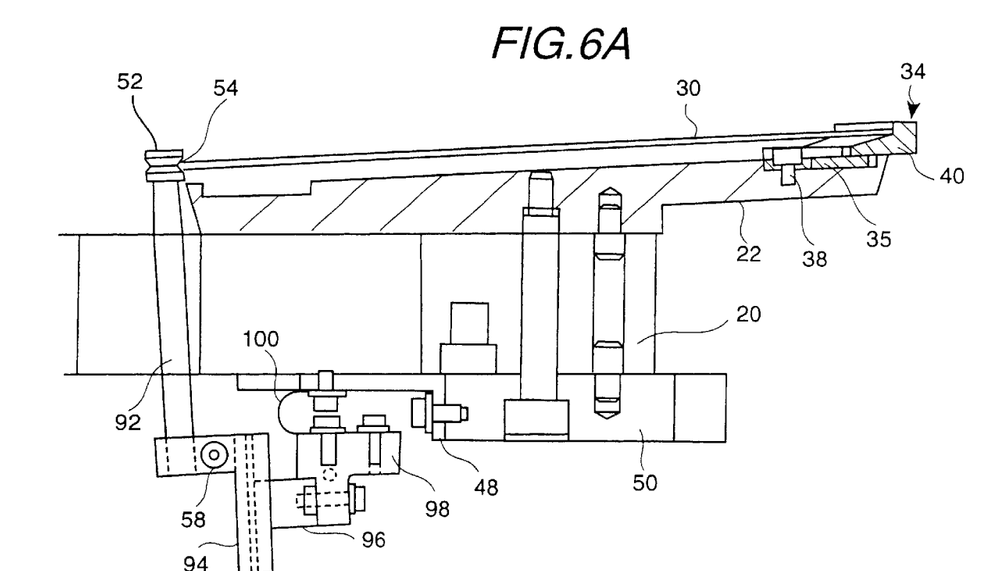
FIG. 6 is views showing a fourth embodiment of an ion implanting apparatus in accordance with the present invention, and (a) is a cross-sectional view showing the main portion, and (b) is a back view showing the support portion.
Figure 6B:
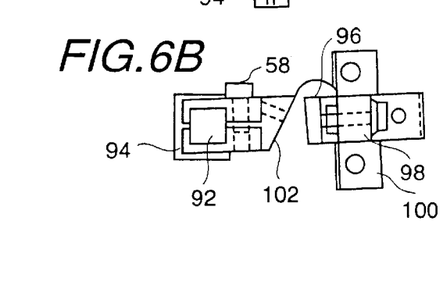

A fourth embodiment of the holding portion 36 will be described below, referring to FIG. 6.

The holding portion 36 in this embodiment is composed of a wafer supporting piece 92, a mounting clamp 94, a U-shaped plate spring 96, a mounting clamp 98, a U-shaped plate spring 100, a bracket 48 and a positioning block 50. That is, the holding portion 36 in this embodiment has the plate spring 96 as the first elastic body and the plate spring 100 as the second elastic body instead of the coil spring, and each of the plate springs 96, 100 is formed in the same shape as that of the plate spring 46. The plate springs 96, 100 are disposed so that the acting directions of the elastic forces are different from each other, that is, the acting directions of the elastic forces intersect with each other, and ends of the plate spring 96 are connected to the mounting clamps 94, 98. An end portion in the axial direction of the wafer supporting piece 92 is fixed to the mounting clamp 94 in a state of being clamped by the mounting clamp 94 and fastened with a screw 58. The height of the wafer supporting piece 92 can be adjusted by loosing the screw 58. Further, one end of the plate spring 96 is fixed to a taper portion 102 of the mounting clamp 94, and the other end of the plate spring 96 is connected to the mounting clamp 98. One end of the plate spring 100 is connected to the upper side of the mounting clamp 98, and the other end of the plate spring 100 is connected to the bracket 48.

In this embodiment, when the silicon wafer 30 is thermally deformed due to thermal expansion and the silicon wafer 30 expands in the direction of the thermal expansion, that is, when the silicon wafer 30 thermally expands toward the wafer supporting piece 92, a force pushing the wafer supporting piece 92 acts on the plate spring 100 so as decrease the opening angle of the plate spring 100. Therefore, the wafer supporting piece 92 is moved following to the movement of the thermal expansion of the silicon wafer 30. Thereby, the thermal deformation caused by the thermal expansion of the silicon wafer 30 can be absorbed.

When the silicon wafer 30 is thermally expanded and such a force as to move the wafer supporting piece 92 on an arc-locus along the outer periphery of the silicon wafer 30 is acts on the wafer supporting piece 92, the wafer supporting piece 92 is moved following the thermal expansion of the wafer 30 by changing the opening angle of the plate spring 96. Therefore, even if the silicon wafer 30 is thermally expanded in the direction intersecting with the line connecting between the holding portion 34 and the holding portion 36, the thermal expansion can be absorbed.

Figure 7:
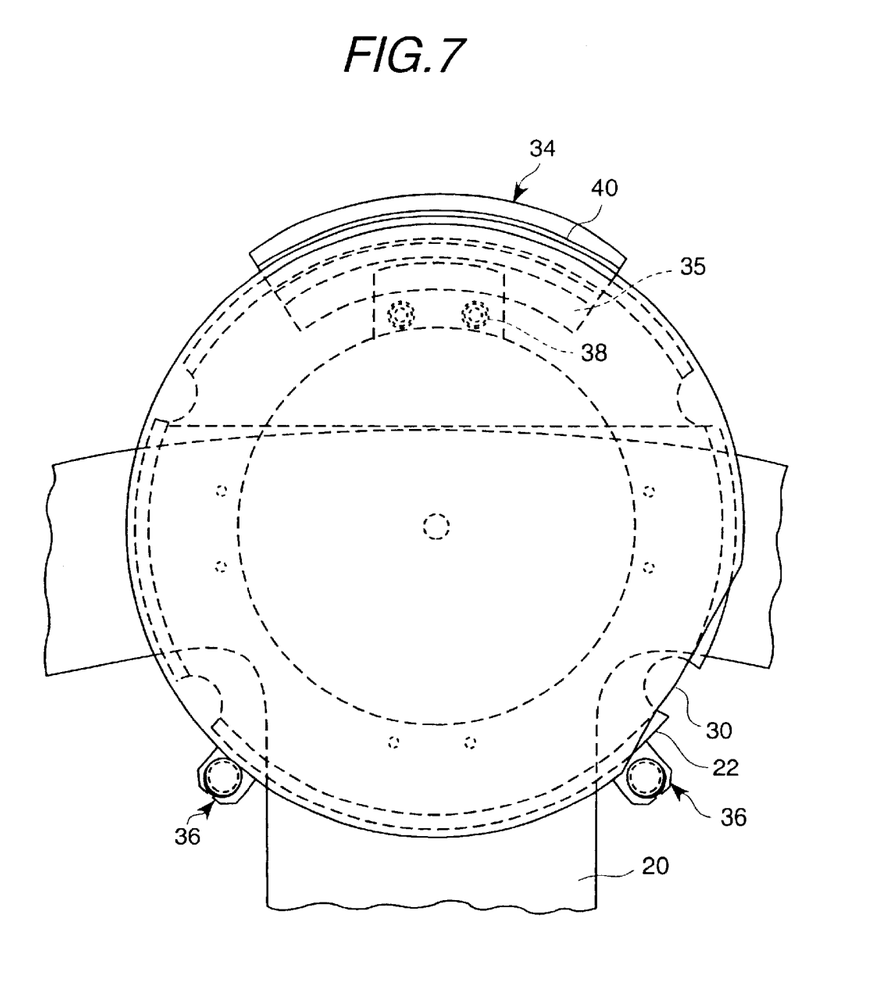
FIG. 7 is a plan view showing the main portion of an embodiment when a plurality of support portions are disposed.

Although each of the embodiments described above has the single holding portion 36, expansion of the silicon wafer 30 can be certainly absorbed by providing two holding portions 36, as shown in FIG. 7.

Figure 8:
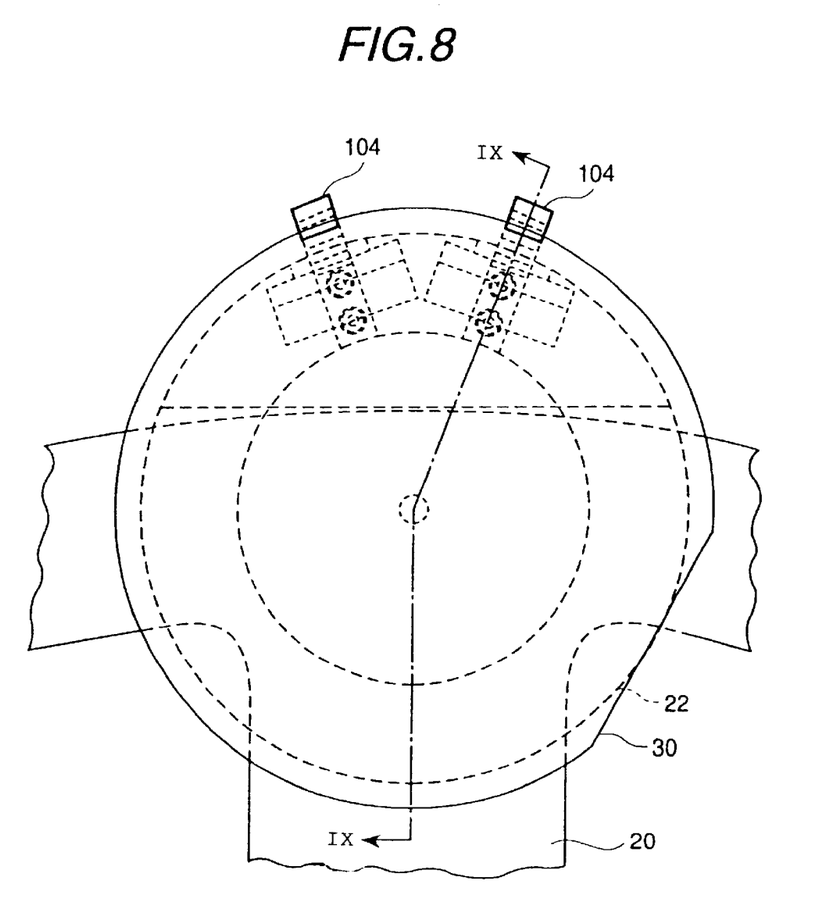
FIG. 8 is an enlarged plan view an embodiment of a support portion of a cantilever structure.
Figure 9:
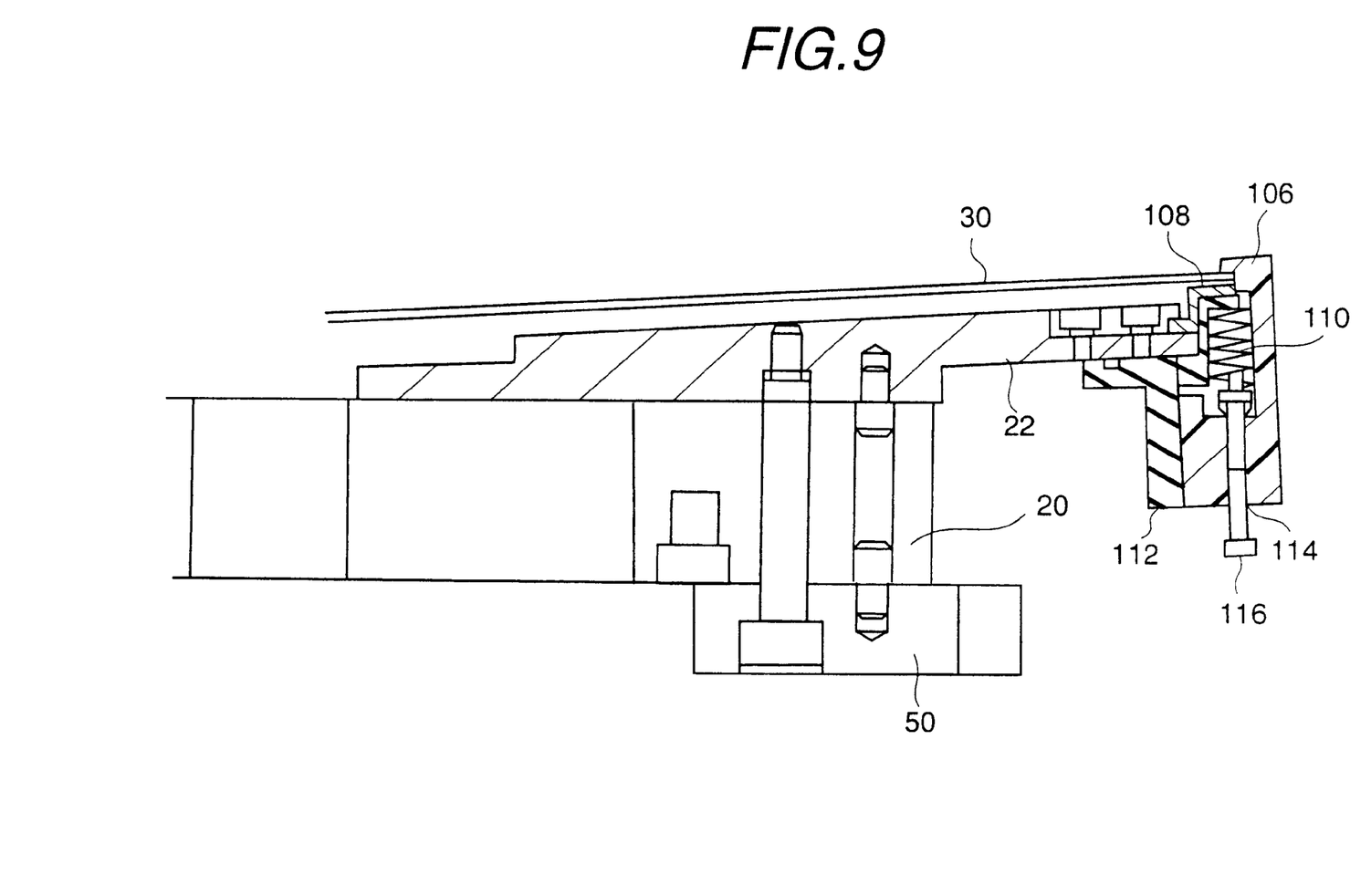
FIG. 9 is a cross-sectional view showing the main portion being taken on the plane of the line IX—IX of FIG. 8.

An embodiment of a holding portion of a cantilever structure as the holding means will be described below, referring to FIG. 8 and FIG. 9.

In the present embodiment, the wafer holder 22 comprises two holding portions 104 of a cantilever structure arranged at two positions in a region having the most largest centrifugal force among centrifugal forces acting on a silicon wafer 30, that is, in a region the most away from the rotating center of the rotating disk 20. Each of the holding portions 104 is composed of an upper fixing piece 106, a lower fixing means 108, a coil spring 110 and a mounting clamp 112, and the mounting clamp 112 is fixed to the bottom portion side of the wafer holder 22. The bottom portion side of the upper fixing piece 106 is vertically movably attached to the mounting clamp 112, and an adjusting screw 116 is inserted into a through hole 114 of the upper fixing piece 106. The upper fixing piece 106 and the lower fixing piece 108 are formed of, for example, silicon or quartz, and the silicon wafer 30 is held in a state that both surfaces in the axial direction (upper surface and reverse surface) at an end in the outer peripheral side of the wafer 30 are interposed between the upper fixing piece 106 and the lower fixing piece 108. The lower fixing piece 108 is fixed to the wafer holder 22 in contact with the upper portion side of the mounting clamp 112. The coil spring 110 is inserted inside a hollow portion formed between the upper portion side of the mounting clamp 112 and the bottom portion side of the upper fixing piece 106, and one end of the coil spring 110 is pushed with an adjusting screw 116. By adjusting the length of the adjusting screw 116, the coil spring 110 is expanded and contracted corresponding to the length of the adjusting screw 116, and the upper fixing piece 106 is vertically moved corresponding to an elastic force of the coil spring 110 to adjust a fixing force to the silicon wafer 30 by a position of the upper fixing piece 106.

In the present embodiment, by holding the region in one side of the silicon wafer 30 with the holding portions 104 arranged at the two positions, the one end of the silicon wafer 30, that is, the region held by the holding portions can be blocked to move in the acting direction of the centrifugal force, and the other end (the side opposite to the side of the holding portions) of the silicon wafer 30 can be allowed to move in the acting direction of the centrifugal force.

According to the present embodiment, the silicon wafer 30 is held only by the holding portions 104 in the upper surface and the reverse surface, and there is nothing else to restrict movement of the silicon wafer 30. Therefore, since thermal expansion of the silicon wafer 30 is allowed even if the thermal expansion occurs in the silicon wafer by heating of the heater or by heat produced by the beam irradiation, it is possible to prevent the silicon wafer 30 from being cracked, chopped and warped. Further, since the reverse side surface of the silicon wafer 30 is not in contact with the wafer holder 22, it is possible to maintain the silicon wafer 30 at a high temperature state and to prevent production of particles produced by scraping between the silicon wafer 30 and the wafer holder 22.

Further, in each of the embodiments described above, by making each of the supporting pieces 42, 76, 84, 92 and the holding portions 104 using a material equivalent to the silicon wafer 30, that is, silicon or quartz, it is possible to certainly prevent production of particles from the silicon wafer.

As having been described above, according to the present invention, by holding only a part of the region in the outer peripheral side of the object to be ion-implanted, the object to be ion-implanted is blocked to move toward the acting direction of a centrifugal force and allowed to move toward the direction opposite to the acting direction of a centrifugal force. Therefore, the object to be ion-implanted can be maintained at a high temperature state, occurrence of cracks, chopping and warping caused by thermal deformation of the object to be ion-implanted can be prevented, and production of particles caused by the thermal deformation can be prevented. Therefore, the quality of the products can be improved.

Further, although the above embodiments have described on the cases where the ion beam is irradiated onto a silicon wafer, the present invention is not limited to the ion implanting apparatus. The above embodiments can be applied to all sample processing apparatuses in which a beam having an electromagnetic wave characteristic is irradiated on a silicon wafer.

What is claimed is:

1. An ion implanting apparatus comprising:

an ion source for producing an ion beam;

a process chamber for containing a plurality of wafers to be ion-implanted;

a rotating body disposed and rotated in the process chamber;

a plurality of wafer holders fixed to the rotating body to support the wafers in an inclined state to a rotating plane of the rotating body; and ion beam irradiation means for irradiating the ion beam from the ion source toward the wafers to be implanted in the process chamber, wherein the wafer holders include a first supporting portion supporting the wafers to be ion-implanted, in a state in contact with a part of a region at a periphery of each wafer to be ion-implanted, and so as to block the wafers to be ion-implanted from moving toward an acting direction of centrifugal force due to rotation of the rotating body during ion irradiation of the wafers by the ion beam irradiation means; and the wafer holders include a second supporting portion supporting an end of each wafer to be ion-implanted, so as to raise the wafers against the first supporting portion, the second supporting portion being supported by a spring attached to the wafer holders.

* * * * *